(12) United States Patent
Wang et al.

(10) Patent No.: US 12,321,854 B2
(45) Date of Patent: Jun. 3, 2025

(54) MATERIALS ARTIFICIAL INTELLIGENCE ROBOTICS-DRIVEN METHODS AND SYSTEMS

(71) Applicant: Automat Solutions, Inc., San Leandro, CA (US)

(72) Inventors: Xiaoliang Wang, Alameda, CA (US); Xuejun Wang, Pleasanton, CA (US); Dongpeng Liu, Columbia, MO (US)

(73) Assignee: Automat Solutions, Inc., San Leandro, CA (US)

( * ) Notice: Subject to any disclaimer, the term of this patent is extended or adjusted under 35 U.S.C. 154(b) by 960 days.

(21) Appl. No.: 17/204,858

(22) Filed: Mar. 17, 2021

(65) Prior Publication Data

US 2021/0397949 A1    Dec. 23, 2021

Related U.S. Application Data

(60) Provisional application No. 63/040,133, filed on Jun. 17, 2020.

(51) Int. Cl.

| | |
|---|---|
| *G06N 3/08* | (2023.01) |
| *C40B 60/00* | (2006.01) |
| *G01N 27/07* | (2006.01) |
| *G01R 27/00* | (2006.01) |
| *G01R 31/367* | (2019.01) |
| *G06N 3/02* | (2006.01) |
| *H01M 10/04* | (2006.01) |
| *H01M 10/42* | (2006.01) |

(52) U.S. Cl.
CPC ............. *G06N 3/08* (2013.01); *C40B 60/00* (2013.01); *G01R 31/367* (2019.01); *G06N 3/02* (2013.01); *H01M 10/04* (2013.01); *B01J 2219/00313* (2013.01); *B01L 2300/0829* (2013.01); *G01N 27/07* (2013.01); *G01R 27/00* (2013.01); *H01M 10/4285* (2013.01)

(58) Field of Classification Search
None
See application file for complete search history.

(56) References Cited

U.S. PATENT DOCUMENTS

2006/0001430 A1*   1/2006   Kepler .............. H01M 8/04007
                                                                           324/426
2021/0098084 A1*   4/2021   Park ....................... G16C 20/40

OTHER PUBLICATIONS

Dave et al., "Autonomous Discovery of Battery Electrolytes with Robotic Experimentation and Machine Learning," Cell Reports Physical Science 1, Dec. 2020.*

(Continued)

*Primary Examiner* — Jonathan Crepeau
(74) *Attorney, Agent, or Firm* — Cognition IP, P.C.; Edward Steakley; Justin White

(57) ABSTRACT

A system, computer program product and a method to predict an objective function based on a recipe, and generate, via a machine learning model, a plurality of proposed different recipes of battery materials for optimizing at least objective function. Instances of the different proposed recipes of battery materials are prepared and deposited into an electrochemical module by a robotic preparation module. A robotic testing module executes a plurality of formulation characteristic tests on each deposited recipe instance and updates the machine learning model with a result of at least one of the formulation characteristic tests.

22 Claims, 13 Drawing Sheets

(56) References Cited

OTHER PUBLICATIONS

Min et al., "Machine Learning Assisted Optimization of Electrochemical Properties for Ni-Rich Cathode Materials," Scientific Reports, Oct. 2018.*
Hahn et al., "Micro Patterned Test Cell Arrays for High-Throughput Battery Materials Research," 2017 Symposium on Design, Test, Integration & Packaging of MEMS and MOEMS, 2017.*
Su et al., "Electrolyte Development for Non-Aqueous Redox Flow Batteries Using a High-Throughput Screening Platform," Journal of the Electrochemical Society 161 (12), Sep. 2014, A1905-A1914.*
Cartier et al., "A Combinatorial Approach toward the Discovery of Electrolyte Formulations for Non-Aqueous Electrochemical Energy Storage Devices," ECS Electrochemistry Letters 4(9), A110-A115, Jul. 2015.*

* cited by examiner

Proposed Recipes ~182

| | Polymer A Type | Polymer A wt% | Polymer B Type | Polymer B wt% | Li Salt Type | Li Salt wt% | Plasticizer A Type | Plasticizer A wt% | Plasticizer B Type | Plasticizer B wt% | Additive Type | Additive wt% |
|---|---|---|---|---|---|---|---|---|---|---|---|---|
| 182-1 | PBP | 17.4 | LAPPE1 | 17.4 | S2ALP | 17.4 | DO | 17.4 | N | 12.8 | AO | 17.4 |
| 182-2 | PBP | 17.6 | LAPPE1 | 17.6 | S2ALP | 17.6 | DO | 17.6 | N | 11.9 | SMMS | 17.6 |
| | LPE16 | 16.7 | LAPPE4 | 16.7 | LBI | 16.7 | Et | 16.7 | D | 16.7 | LMMS | 16.7 |
| | LPE7 | 17.5 | LAPPE1 | 17.5 | LBI | 17.5 | Pr | 17.5 | D | 12.4 | LMMS | 17.5 |

FIG. 2

| Category | Chemical |
|---|---|
| Polymer | Aramid |
| | Poly(ethylene glycol) diacrylate |
| | Poly(ethylene oxide) |
| | Poly(propylene oxide) |
| | Poly(vinylidene fluoride) |
| | Poly[bis(methoxy ethoxyethoxide)-phosphazene] |
| | Polyacrylonitrile |
| | Polysiloxane |
| | poly(vinylidene fluoride-trifluoroethylene) |
| | Epoxidized natural rubber ENR50 |
| | Poly(methacrylic acid) |
| | Poly(methyl methacrylate) |
| | Poly(methyl methacrylate-ran-lithium methacrylic acid) |
| | Poly(propylene carbonate) |
| | Polystyrene |

| Category | Chemical |
|---|---|
| Li salt | Lithium -2-(Phenylsulfanyl)-1,1,2,2-tetrafluoroethanesulfonate |
| | Lithium 1,1,2,2-tetrafluoro-2-(perfluoroethoxy)ethanesulfonate (LiTPSN) |
| | Lithium bis(fluorosulfonyl)imide |
| | Lithium bis(oxalato)borate |
| | Lithium bis(perfluoroethylsulfonyl)imide |
| | Lithium hexafluoroarsenate |
| | Lithium hexafluorophosphate |
| | Lithium perchlorate |
| | Lithium tetrafluoroborate |
| | Lithium trifluoromethanesulfonate |
| | Lithium trifluoromethylsulfonylimide |
| | lithium[tetrafluoro-2-(pentafluoroethoxy)ethane]-trifluoromethanesulfonimide (LiTPSM) |

FIG. 6A

| Category | Chemical |
|---|---|
| Plasticizer | Esterified polyethylene glycol |
| | Ethylene carbonate |
| | Polyethylene glycol |
| | Polyethylene glycol dimethyl ether |
| | Propylene carbonate |
| | Water |
| | Diethyl carbonate |
| | Dimethyl carbonate |
| | Dibuytl phthalate |
| | Succinonitrile |

| Category | Chemical |
|---|---|
| Additive | MCM-41 silica |
| | Silica |
| | aluminum oxide |
| | amorphous CNT |
| | fumed silica A200 |
| | gamma-LiAlO2 |
| | montmorillonite |
| | alfa-Al2O3 |

FIG. 6B

| Category | Chemical |
|---|---|
| Additive | MCM-41 silica |
| | Silica |
| | aluminum oxide |
| | amorphous CNT |
| | fumed silica A200 |
| | gamma-LiAlO2 |
| | montmorillonite |
| | alfa-Al2O3 |

FIG. 6C

MATERIALS ARTIFICIAL INTELLIGENCE ROBOTICS-DRIVEN METHODS AND SYSTEMS

CROSS-REFERENCE TO RELATED APPLICATIONS

This application claims the benefit of U.S. Provisional Application 63/040,133, filed Jun. 17, 2020, which is hereby incorporated by reference in its entirety.

BACKGROUND

The conventional material research and development is mainly driven by human intuition, labor, and manual decision. It is ineffective and inefficient. Due to the complexity of material design, and the magnitude of experimental and computational work, the discovery of materials with conventional methods usually takes very long development cycles (10-20 years) with enormous human and financial costs.

SUMMARY

Further areas of applicability of the present disclosure will become apparent from the detailed description, the claims and the drawings. The detailed description and specific examples are intended for illustration only and are not intended to limit the scope of the disclosure.

Various embodiments described herein are directed to a system, computer program product and a method for a Materials Artificial Intelligence Robotics-driven System (MARS). MARS includes a machine learning framework, a knowledge data base that includes training data, a robotic preparation module and a robotic testing module. Embodiments described herein provide the advantage of accelerating advanced materials and device research and development. Various embodiments of MARS are centralized, autonomous, combinatorial, and closed-loop and combine machine learning and robotic high-throughput automation. According to various embodiments, MARS may be implemented to discover new high-performance battery materials and improve existing battery materials, including one or more recipe components for the electrolyte (polymer/liquid), the cathode and the anode, as well as battery devices.

According to various embodiments, MARS generates, via the machine learning model, a plurality of proposed different recipes of battery materials optimization of at least one objective function. Instances of the different recipes of battery materials are prepared and deposited into an electrochemical module by a robotic preparation module. A robotic testing module executes a plurality of formulation characteristic tests on each deposited recipe instance and updates the machine learning model with a result of at least one of the formulation characteristic tests. Various embodiments may be also be directed to recipes for electrochemical materials, catalysts, solar cells, photovoltaics and 3D printing materials.

According to various embodiments, the plurality of proposed different recipes of battery materials may be a plurality of different polymer electrolyte recipes, a plurality of different liquid electrolyte recipes, a plurality of different cathode recipes or a plurality of different anode recipes. Each plurality of proposed different recipes represents battery materials for optimizing at least one objective function, such as, for example: conductivity, lithium transference number, lithium diffusion coefficient, cathodic stability, anodic stability, viscosity, color, surface tension, solubility and cost. Additional objective functions optimized by recipes are described herein as well.

The robotic preparation module prepares and deposits an instance of each different recipe into an electrochemical module and the robotic testing module executes one or more tests on the deposited recipe instances and testing results are fed back into the machine learning model by the robotic testing module for tuning the knowledge base data of the machine learning model.

Additional features and advantages will be set forth in the description which follows, and in part will be implicit from the description, or may be learned by the practice of the embodiments.

BRIEF DESCRIPTION OF THE DRAWINGS

The present disclosure will become better understood from the detailed description and the drawings, wherein:

FIG. 2 is a diagram illustrating exemplary recipes according to some embodiments;

FIGS. 6A, 6B, 6C provide lists of exemplary types of training data according to some embodiments;

DETAILED DESCRIPTION

Figure 1A:
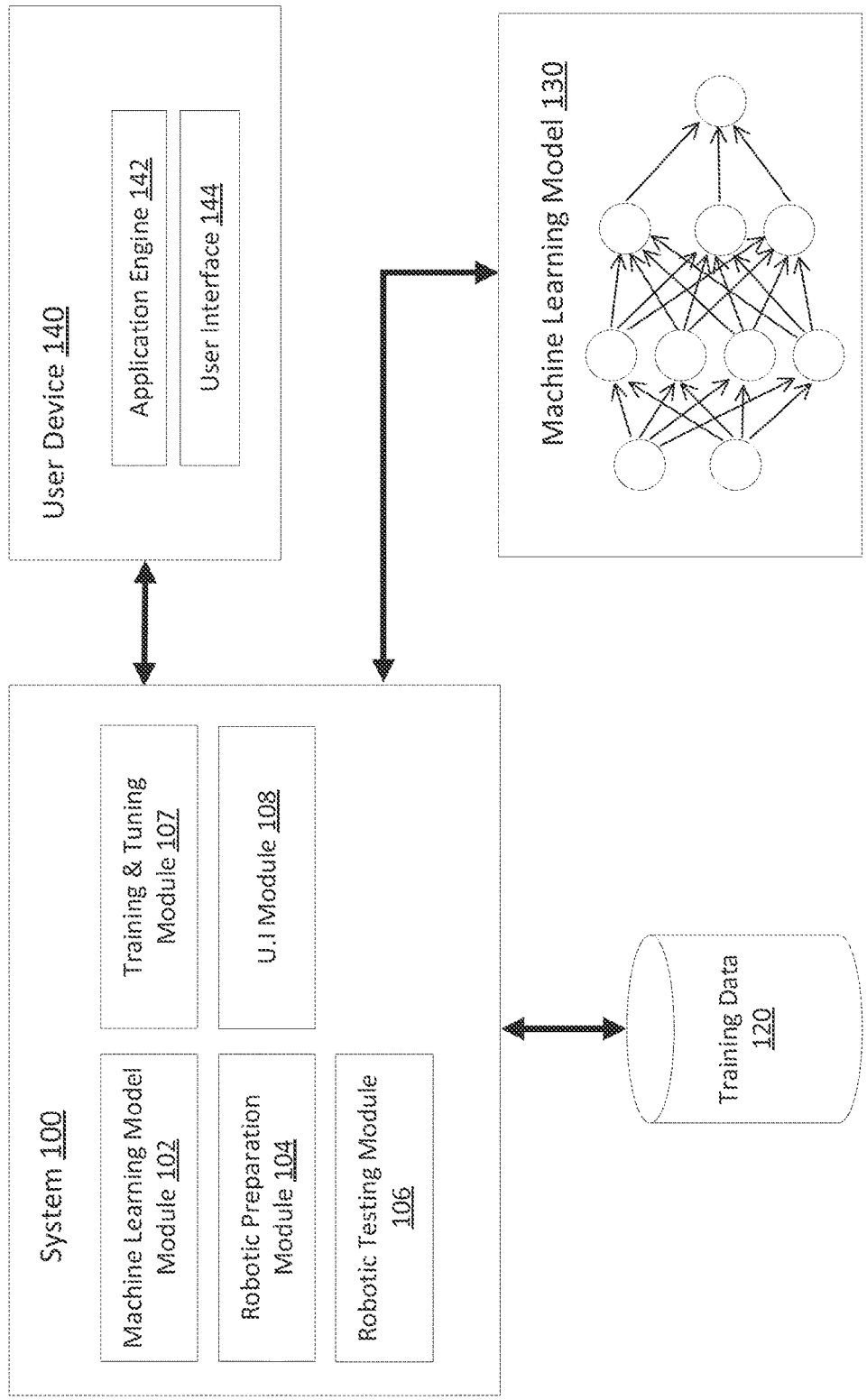
FIG. 1A is a diagram illustrating an exemplary environment in which some embodiments may operate.

In this specification, reference is made in detail to specific embodiments of the invention. Some of the embodiments or their aspects are illustrated in the drawings.

For clarity in explanation, the invention has been described with reference to specific embodiments, however it should be understood that the invention is not limited to the described embodiments. On the contrary, the invention covers alternatives, modifications, and equivalents as may be included within its scope as defined by any patent claims. The following embodiments of the invention are set forth without any loss of generality to, and without imposing limitations on, the claimed invention. In the following description, specific details are set forth in order to provide a thorough understanding of the present invention. The present invention may be practiced without some or all of these specific details. In addition, well known features may not have been described in detail to avoid unnecessarily obscuring the invention.

In addition, it should be understood that steps of the exemplary methods set forth in this exemplary patent can be performed in different orders than the order presented in this specification. Furthermore, some steps of the exemplary methods may be performed in parallel rather than being performed sequentially. Also, the steps of the exemplary methods may be performed in a network environment in which some steps are performed by different computers in the networked environment.

Some embodiments are implemented by a computer system. A computer system may include a processor, a memory, and a non-transitory computer-readable medium. The memory and non-transitory medium may store instructions for performing methods and steps described herein.

FIG. 1A illustrates a block diagram of an example system 100 for MARS that includes a machine learning model 130 with input training data database 120 that may be continuously updated with test results for tuning the machine learning model 130. The system 100 includes a machine learning module 102, a robotic preparation module 104, a robotic testing module 106, a training & tuning module 107 and user interface (U.I.) module 108. The system 100 may communicate with a user device 140 to display output (such as proposed recipes and test results) via a user interface 144 generated by an application engine 142. The machine learning model 130 and the database 120, may further be components of the system 100 as well. The database 120 may be deployed in a manner to effect retrieval and storage efficiency and/or data security.

The machine learning module 102 of the system 100 may perform functionality as illustrated in FIG. 1B, FIG. 2, FIG. 3A, FIG. 3B and FIG. 4, The robotic preparation module 104 of the system 100 may perform functionality as illustrated in FIG. 1B, FIG. 2, FIG. 3C, FIG. 4, and FIGS. 5A-D.

The robotic testing module 106 of the system 100 may perform functionality as illustrated in FIG. 1B, FIG. 3C, FIG. 4 and FIG. 8.

The training & tuning module 107 of the system 100 may perform functionality as illustrated in FIG. 3A, FIG. 3B, FIG. 4 and FIGS. 6A, 6B and 6C.

The user interface (U.I.) module 108 of the system 100 may perform functionality with respect to display of proposed recipes, test results, training data and any other type of data processed by the system 100.

Figure 1B:
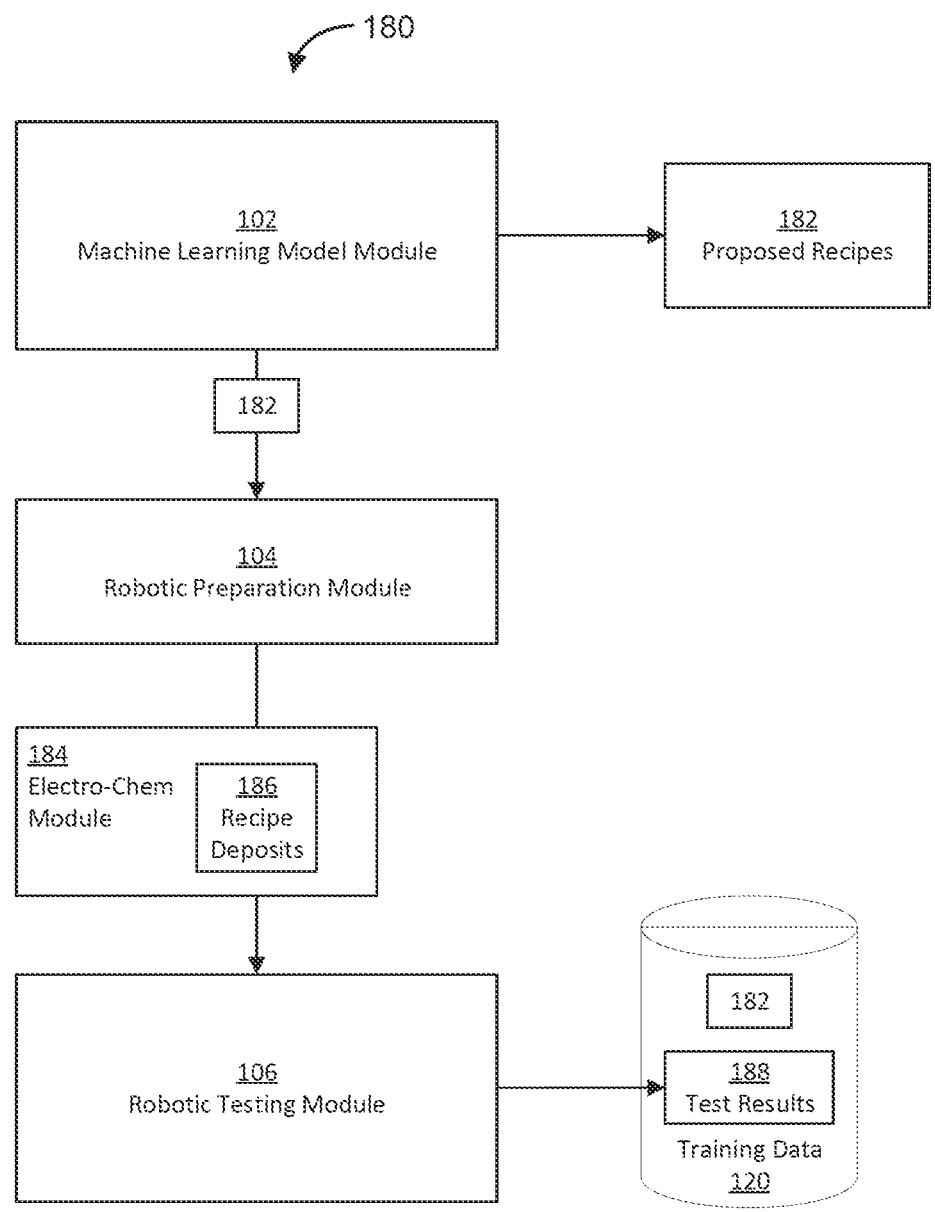
FIG. 1B is a diagram illustrating an exemplary environment in which some embodiments may operate.

As shown in FIG. 1B, the MARS environment 180 includes the machine learning module 102 utilizing the machine learning model 130 to generate one or more output proposed recipes 182. The machine learning module 102 sends the output proposed recipes 182 to the robotic preparation module 104 mixes and prepares an instance of each of the proposed recipes 186 and deposits each prepared recipe instance into a portion of an electro-chemical module 184. The robotic preparation module 104 provides that robotic testing module 106 access to the electro-chemical module 184. The robotic testing module 106 performs one or more tests on any of the deposited recipe instances and generated test results 188 as output. The robotic testing module 106 feeds the proposed recipes 182 and the test results 188 into the training data 120 and the training & tuning module 107 may further tune the machine learning model 130 according to the proposed recipes 182 and the test results 188.

As shown in FIG. 2, the machine learning model 130 returns a plurality of proposed different recipes of battery materials, such as polymer electrolytes, liquid electrolytes, anodes or cathodes. For electrolyte recipes, the machine learning model 130 proposes polymers, plasticizers, lithium salts and additives as well as each components weight percentage. According to various embodiments, the proposed recipes 182 in FIG. 2 are polymer electrolyte recipes proposed by the machine learning model 130 in response to an input request for an optimized objective function, such as conductivity. That is, each of the recipes 182 are based on a prediction by the machine learning model 130 that the various combinations of recipe components (polymers, a lithium salt, plasticizers and an additive) will result in optimized conductivity. For example, the machine learning model 130 determines all components of a first recipe 182-1 to include the Polymer type A of "PBP" at a 17.4 weight percentage, the Polymer type B of "LAPPE1" at a 17.4 weight percentage, a Lithium Salt of "S2ALP" at a 17.4 weight percentage, a Plasticizer type A of "DO" at a 17.4 weight percentage, a Plasticizer type B of "N" at a 12.8 weight percentage and an Additive type of "AO" at a 17.4 weight percentage. The machine learning model 130 determines all components of a second recipe 182-2 to include the Polymer type A of "PBP" at a 17.6 weight percentage, the Polymer type B of "LAPPE1" at a 17.6 weight percentage, a Lithium Salt of "S2ALP" at a 17.6 weight percentage, a Plasticizer type A of "DO" at a 17.6 weight percentage, a Plasticizer type B of "N" at a 11.9 weight percentage ("wt %") and an Additive type of "SMMS" at a 17.6 weight percentage. The wt % of the polymers in the formulation ranges from 2 wt % to 99 wt %, and more preferably, from 50 wt % to 85%. The wt % of the salts in the formulation ranges from 2 wt % to 80 wt %, and more preferably, from 10 wt % to 60 wt %. The wt % of the plasticizers in the formulation ranges from 0 wt % to 90 wt %, and more preferably, from 0 wt % to 30 wt %. The wt % of the additives in the formulation ranges from 0 wt % to 40 wt %, and more preferably, from 00 wt % to 15%.

For proposed recipes of a cathode, the machine learning model 130 proposes various materials given a request to optimize one or more objective functions of a cathode. Candidate materials for cathode recipe components include: Lithium Cobalt Oxide, Lithium Manganese Oxide, Lithium Iron Phosphate, Lithium Manganese Phosphate, Lithium Nickel Phosphate, Lithium Cobalt Phosphate, Spinel lithium manganese oxide, sulfur, (LiBr)0.5(LiCl)0.5—graphite, Lithium Nickel Manganese Cobalt (or NMC), Lithium-rich layer-layer NMC, and Lithium Nickel Cobalt Aluminum Oxide (or NCA). These materials can have a carbon coating on the surface of particles. It is understood that proposed cathode recipes may be based on a subset of the cathode recipe components described herein.

For proposed recipes of an anode, the machine learning model 130 proposes various materials given a request to optimize one or more objective functions of an anode. Candidate materials for anode recipe components include: lithium metal, lithium aluminum alloy, lithium magnesium alloy, silicon, silicon oxide, tin, tin iron alloy, tin nickel alloy, tin copper alloy, tin cobalt alloy, tin oxide, germanium, germanium oxide, graphite, graphene, lithium titanate, and single metal oxides of manganese (Mn), iron (Fe), cobalt (Co), nickel (Ni), copper (Cu), ruthenium (Ru), chromium (Cr), molybdenum (Mo), and tungsten (W) and their common binary metal oxides. These materials can have a carbon coating on the surface of particles. It is understood that proposed anode recipes may be based on a subset of the anode recipe components described herein.

Figure 3A:
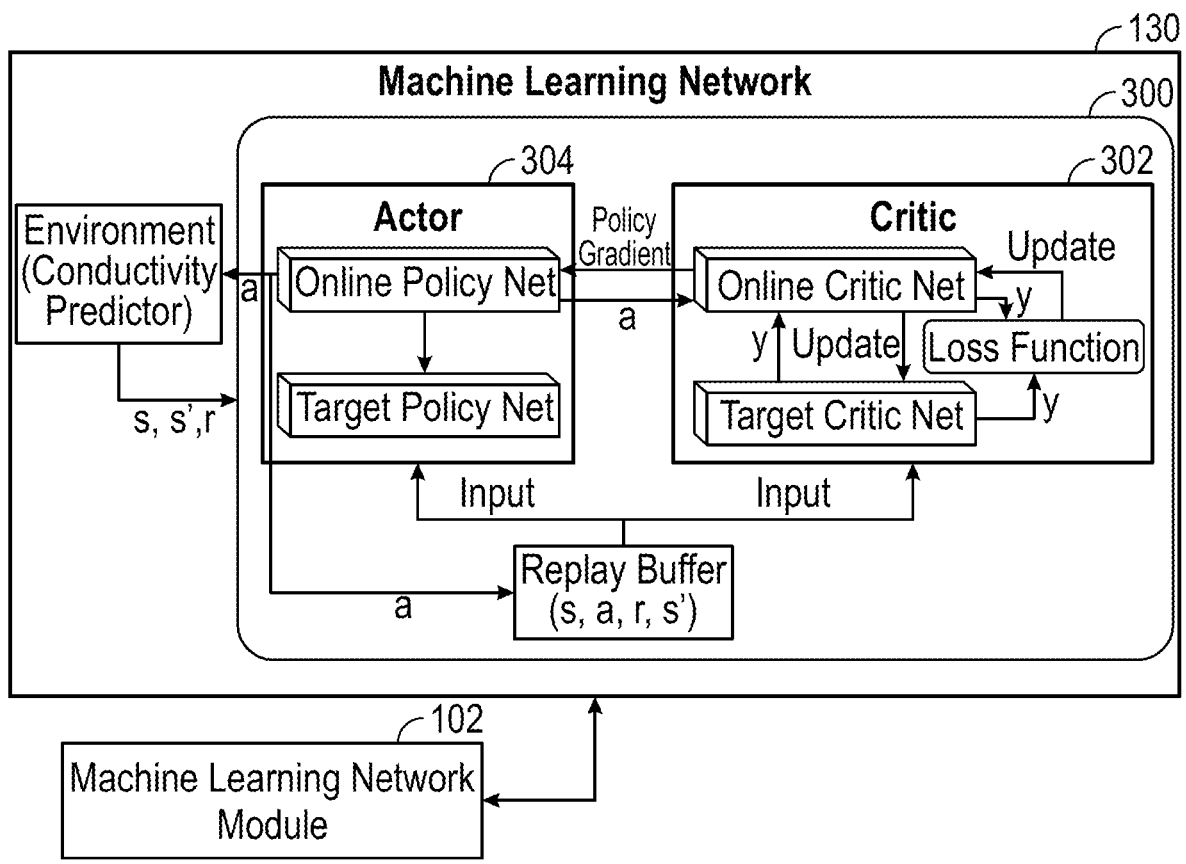
FIG. 3A is a diagram illustrating an exemplary environment in which some embodiments may operate.
Figure 3B:
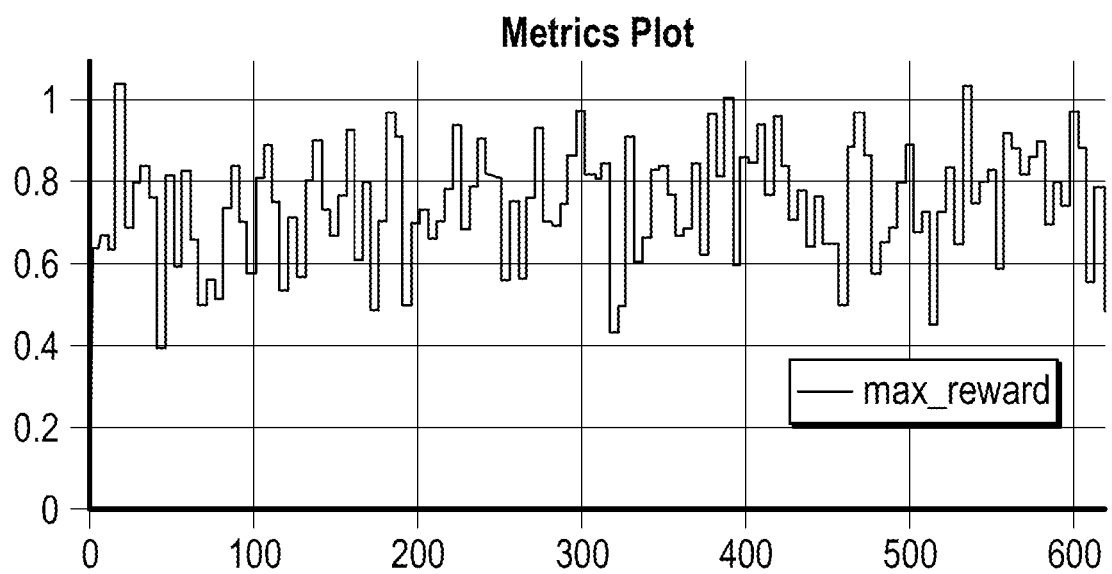
FIG. 3B is a graph associated with an exemplary environment in which some embodiments may operate.

As shown in FIG. 3A, the machine learning model 130 includes a reinforcement learning model 300 based on Deep Deterministic Policy Gradient modeling. The input of the critic network 302 is action and observation, and the output is value function estimation Q(s, a). In addition, a neural network is used to approximate the policy function, also known as actor network 304, and its input is observation s, the output is action a. The critic network 302 and actor network 304 are represented as Q(s, a; ω) and a=π(s; θ), respectively. Here, ω and θ denote parameters in the model 300, which will be learned through training using actual data. The hyper-parameters, such as learning rate in the model, are constant and they will be set empirically. An asynchronous update target network is used to ensure the parameter convergence.

The connection between the critic network 302 and the actor network 304 is as follows: first the environment gives an observation, the agent makes a decision to take an action based on the return of actor network, and the environment receives the action and gives a reward R and the new observation. This process is called time step of an iteration that updates the critic network 302 according to reward R, and then updates the actor network 304 in the direction of the critic network 302. Iterations may continue in order to train one or more networks of actors 302, 304 based on the Deterministic Policy Gradient Theorem. It is understood that the data processed by the model 300 may be based on the training 120, any proposed recipes and any test results.

It is understood that machine learning framework 130 may include, and is not limited to, a model based on a neural net based algorithm, such as Artificial Neural Network, Deep Learning; a robust linear regression algorithm, such as Random Sample Consensus, Huber Regression, Bayesian Regression, or Theil-Sen Estimator; a tree-based algorithm, such as Classification and Regression Tree, Random Forest, Extra Tree, Gradient Boost Machine, or Alternating Model Tree; Naïve Bayes Classifier; and other suitable machine learning algorithms, such as LightGBM. The graph of FIG. 3B portrays representative predicted normalized ionic conductivity of polymer electrolytes generated by the machine learning model 130. The X axis represents the electrolyte sample number. In various embodiments, there may be more than 600 generated formulations in each plot. The Y axis represents the normalized ionic conductivity. The reinforcement learning model 130 generates and optimizes formulations (i.e. recipes) with ionic conductivity higher than a maximum conductivity represented in the training data 120 (i.e. normalized conductivity >1, or ionic conductivity of as high as $3.7 \times 10'$S/cm).

Figure 3C:
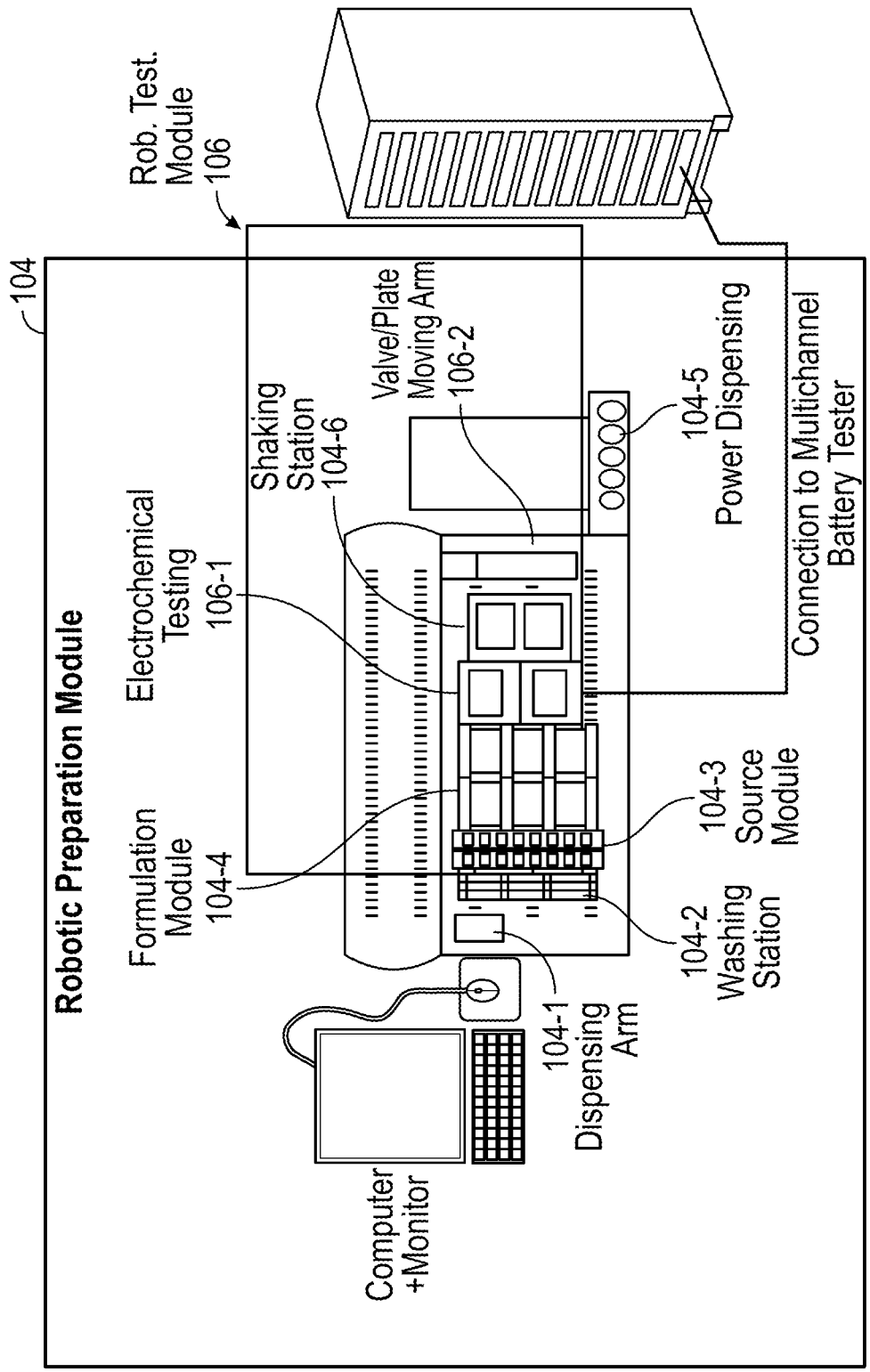
FIG. 3C is a diagram illustrating an exemplary environment in which some embodiments may operate.

As shown in FIG. 3C, the robotic preparation module 104 includes a dispensing arm 104-1 for aspirating and dispensing different solutions to different substrates with multiple vials (or wells) to create instances of proposed recipes. A washing station 104-2 is deployed for cleaning of dispensing needles and heads to prevent cross-contamination in between preparation of different recipes. The robotic preparation module 104 includes a source module 104-3 for acquiring the various components of a proposed recipe. The robotic preparation module 104 further includes a formulation module 104-4 at which various components of a proposed recipe are combined and mixed to prepare an instance of the respective proposed recipe. According to various embodiments, robotic preparation module 104 prepares the recipe instances as respective deposits in an electro-chemical module.

The robotic testing module 106 may include an electrochemical testing connection 106-1 to a multichannel battery testing system for testing of properties of battery materials in deposited recipes (such as, as a non-limiting example, ionic conductivity, stabilities of deposited recipes). The robotic testing module 106 includes a Vials/Plate moving arm 106-2 for moving vials and substrate between various positions based on experiment protocol(s). For example, when a substrate of a proposed recipe is mixed and being shaken by the shaking station 106-2, an experiment protocol may require the arm 106-2 to move the substrate to a testing station and move another substrate to the shaking station 106-2 for mixing. The robotic preparation module 104 also includes a powder dispenser 104-5 for proposed recipe sample preparation and a shaking station 104-2 for mixing the proposed recipes inside vials or wells by orbital shaking or magnet stirring of a substrate with controlled temperature to ensure the best mixing results. The powder dispenser 104-5 may automatically distribute solid powders to different vials/wells based on an experiment's design (e.g. test's design). In some embodiments, a "pick and place" robotic system is used for placing polymer electrolyte films and electrode disks into the electro-chemical module. In some embodiments, polymer electrolytes are prepared using a 8-channel Teflon block.

Figure 4:
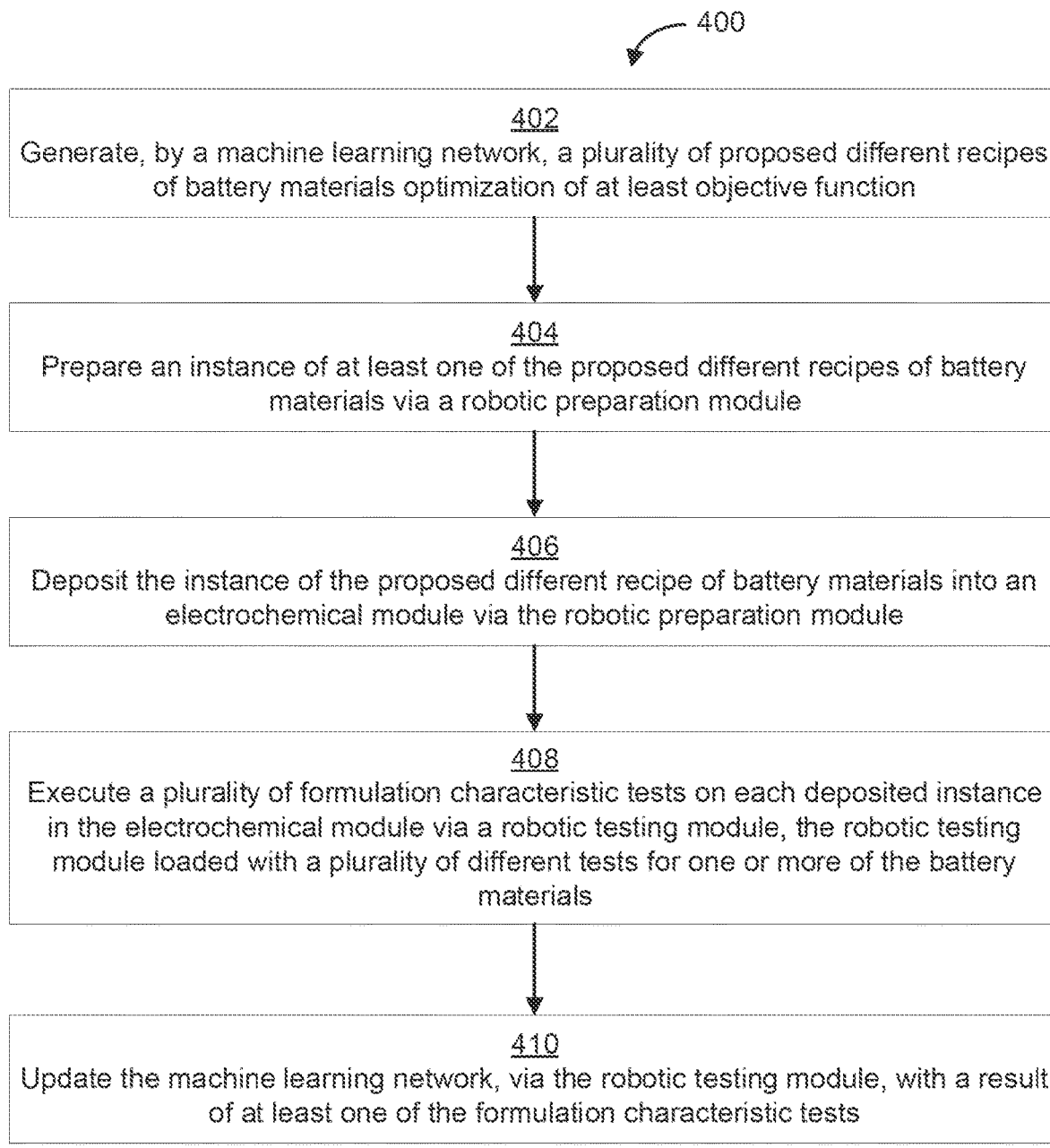
FIG. 4 is a flow chart illustrating an exemplary method that may be performed in some embodiments.

According to the flowchart 400, as shown in FIG. 4, MARS receives a request for one or more optimized objective functions for a select portion of a battery, such as polymer electrolyte, liquid electrolyte, cathode or anode. MARS generates, via the machine learning model, a plurality of proposed different recipes of battery materials optimization of at least objective function (Act 402). The machine learning model 130 may include a training & tuning module 107 to train the machine learning model 130 according to training data 120 that includes one or more parameter types, such as (for example): one or more chemicals, one or more compositions, one or more components, one or more physical properties and one or more processes. The machine learning model 130 may also be trained according to the training data 120 regarding one or more objective functions that correspond to the parameter types. The machine learning model 130 is tuned by the training & tuning module 107 to identify one or more combinations of the parameter types that are compatible to the extent to create the requested optimization of one or more objective functions. For electrolyte recipes, one or more objective functions optimized by proposed recipes generated by MARS may include: ionic conductivity, a lithium transference number, Young's modulus, tensile strength, elongation, adhesion, a lithium diffusion coefficient, cathodic stability, anodic stability, viscosity, color, surface tension, solubility and/or price/cost. For example, ionic conductivity is $\geq 2 \times 10'$S/cm at 25° C., voltage window is 0-4 V or wider (vs. Li), and Young's modulus is ≥10 MPa. Candidate materials for cathode recipe components and anode recipe components are discussed above with regard to FIG. 2. For cathode recipes, one or more objective functions optimized by proposed recipes generated by MARS may include: cathode composition, cathode loading, cathode current collector, lithium current collector, battery voltage and/or battery current density. For anode recipes, one or more objective functions optimized by proposed recipes generated by MARS may include: deposition onset potential, voltage hysteresis and/or cycle life.

According to various embodiments, the machine learning model 130 is trained on polymer electrolyte recipe component(s), such as a polymer component(s), a lithium salt component, and plasticizer component(s), and an additive component(s). However, according to various embodiments, the plasticizer and/or the additive component(s) may be optional recipe components. Additional training data may include physical properties, such as composition and viscosity where the training data encodes a predictive signal based on a direct relationship between the composition (i.e. the recipe) and the viscosity, where the direct relationship predicts that higher concentrations of the electrolyte recipe components (excluding the plasticizer component) results in a higher viscosity.

According to various embodiments, one or more algorithms of the machine learning framework 130 may employ a viscosity requirement as a constraint optimization for identifying proposed recipes. For example, the reinforcement learning search algorithm of the machine learning framework 130 may ultimately exclude a given proposed recipe from being included in an output of proposed recipe results if the given proposed recipe's viscosity is higher than a viscosity upper limit. In the use case of liquid electrolyte recipes, in terms of the relationship between composition and viscosity, again, the higher the concentration of each recipe component, the higher the viscosity. Moreover, the viscosity of the plasticizer (often referred to as the solvent in the liquid electrolyte) is a primary driver in the viscosity of the liquid electrolyte to a large degree. Therefore, in the training data 120, for example, the viscosity of the plasticizer may be limited to no more than 20 cP. For the electrolytes, other input to train the model include water content and hydrofluoric acid content of the electrolyte. Additional training inputs include ionic conductivity, voltage stability and Young's modulus.

Additional training data may include recipe component material data, such as chemical structure and corresponding particle sizes(s), linear formula, price/cost, simplified molecular input line entry system (SMILES) representation, molecular weight, melting point, density, toxicity, and flash point. According to various embodiments, liquid electrolyte recipe component(s) include, such as a lithium salt component, and plasticizer/solvent component(s), and an additive component(s).

MARS prepares an instance of at least one of the proposed different recipes of battery materials via a robotic preparation module (Act 404). For example, the robotic preparation module 104 may retrieve all the components of a proposed recipe and prepare an instance of the proposed recipe according to one or more recipe preparation protocol software programs stored in the robotic preparation module 104. MARS deposits the prepared instance of the proposed different recipe of battery materials into an electrochemical module via the robotic preparation module (Act 406). For example, an electro-chemical module 184 may include multiple channels between an upper bank and lower bank fastened together, where the upper and lower banks each have insertion "T" components that act as respective electrodes. A channel in the electro-chemical module 184 may be filled with a prepared instance of a proposed recipe and situated between an upper bank fastened to a lower bank. The deposited recipe and the insertion "T" components in the upper and lower banks simulate a battery device which can be tested by the robotic testing module 106.

MARS executes a plurality of formulation characteristic tests on each deposited instance in the electrochemical module via a robotic testing module, the robotic testing module being loaded with a plurality of different tests for one or more of the battery materials (Act 408). For example, the robotic testing module 106 may have one or more stored experiments and testing protocols to be applied to one or more deposited instances of proposed recipes. The robotic testing module 106 may apply different experiments and testing protocols to differing deposited instances of proposed recipes and determine the results of each of the respective different experiments and testing protocols. MARS updates the machine learning model 130, via the robotic testing module 130, with a result of at least one of the formulation characteristic tests (Act 410). For example, the robotic testing module 106 may add the proposed recipes and their corresponding test results to the training data 120 and the training & tuning module 107 may update and tune the machine learning model 130 according to the updated training data 120.

It is understood that acts of the flowchart 400 may be performed in different orders, in a reiterative manner or in parallel. Also, the acts of exemplary method 400 may occur in two or more computers, for example if the method 400 is performed in a networked environment. Various acts may be optional. Some acts may occur on a local computer with other acts occurring on a remote computer. It is further understood that the acts of the flowchart 400 may be performed according to iterations in order to converge to a final plurality of recipes.

Figure 5A:
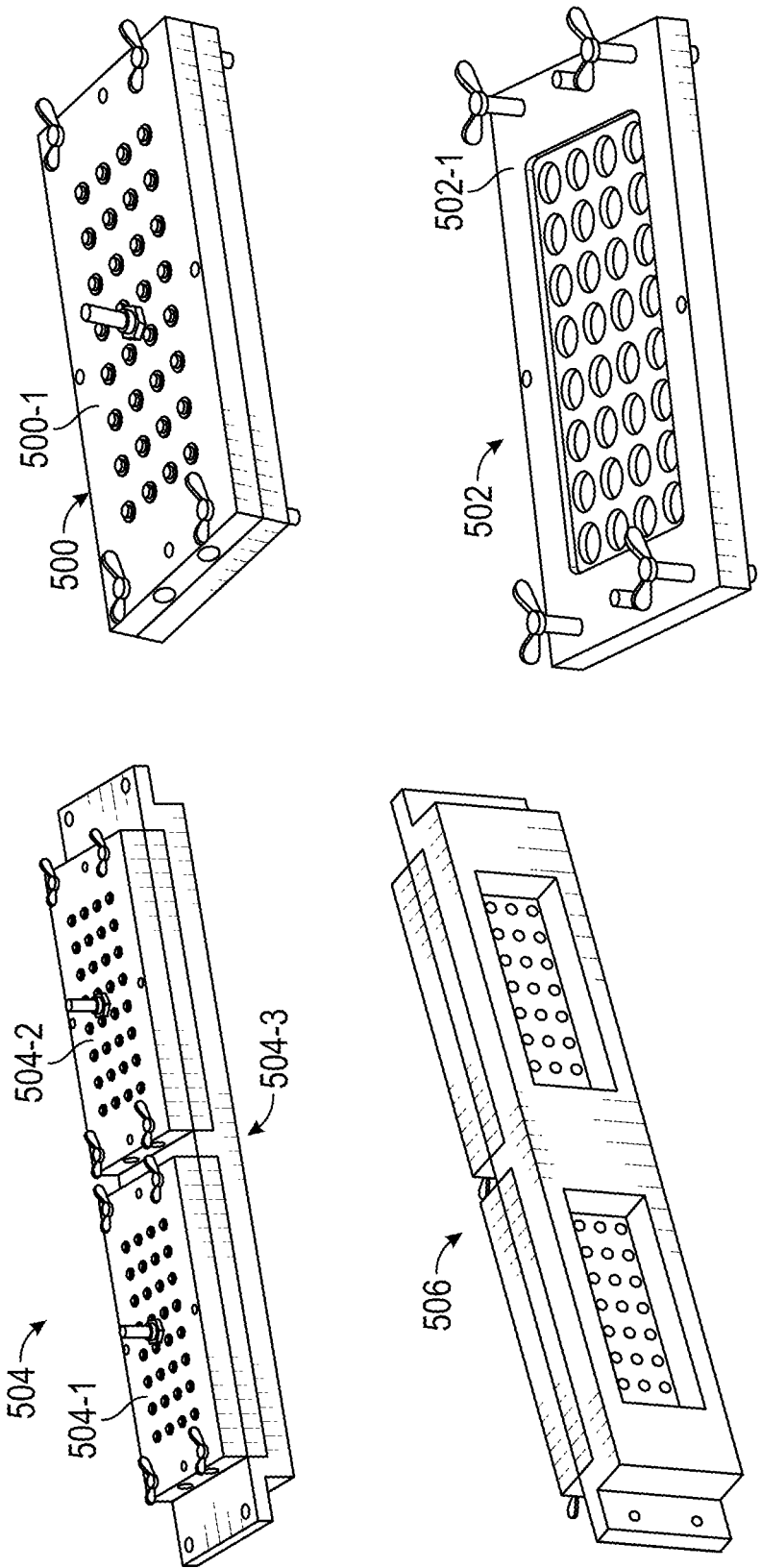
FIG. 5A is a diagram illustrating an exemplary environment in which some embodiments may operate.

As shown in FIG. 5A, various views 500, 502, 504, 506 of an electro-chemical module 184 are illustrated. A first view 500 illustrates a top view of an upper bank 500-1. A second view 502 illustrates a top view of a lower bank 502-1, wherein the upper bank 500-1 can be fastened upon the lower bank 502-1. When an upper bank and lower bank are fastened together, an electro-chemical module is created which contains 32-channels. In various embodiments, both upper and lower banks may be made out of Teflon and each has 32 holes that, when aligned, form the 32-channels. Each channel mimics a battery cell, with anode and cathode connections in the upper and lower block, as well as electrolyte samples sandwiched in between to carry out the charge transport between both electrodes. It is understood that the electro-chemical module is not limited to 32-channels and may have any number of channels.

A third view 504 illustrates a top view of two upper blocks 504-1, 504-2, where upper block 504-1, 504-2 is fastened to a respective lower block. Both fastened upper-lower block pairs are situated in a tray 504-3. The upper-lower block pairs simulate up to 64 channel battery cells with different recipes prepared and deposited by the robotic preparation module 104, such that the robotic testing module 106 may perform one or more tests on each channel. A fourth view 506 illustrates the upper-lower block pairs and tray positioned on one side. As shown in FIG. 5B, a lower block may include 32 wells into which recipe instances prepared by the robotic preparation module 104 may be deposited—as wells as a lower bank insertion "T".

Figure 5C:
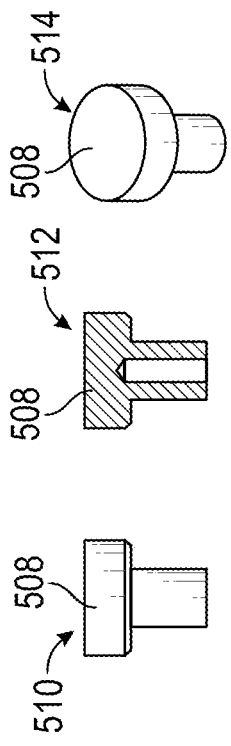
FIG. 5C is a diagram illustrating an exemplary environment in which some embodiments may operate.
Figure 5D:
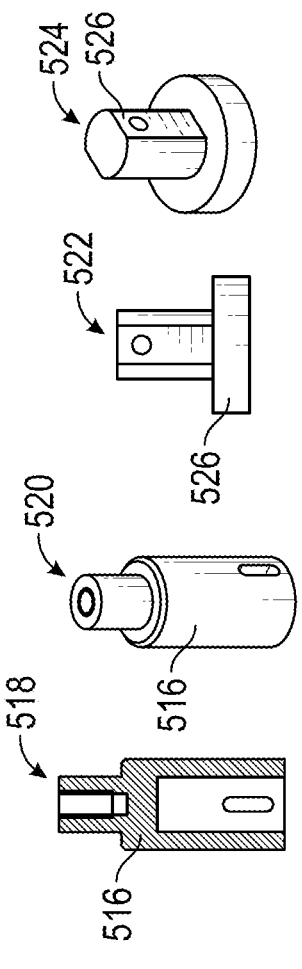
FIG. 5D is a diagram illustrating an exemplary environment in which some embodiments may operate.
Figure 5D:
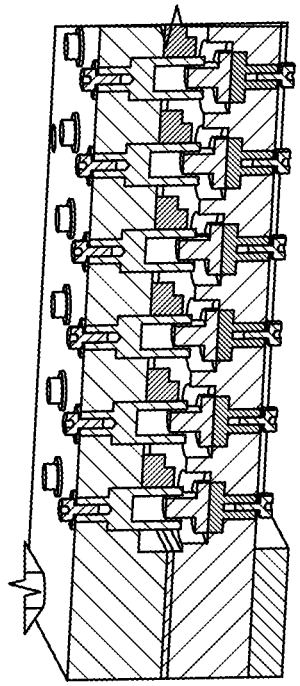
Figure 5B:
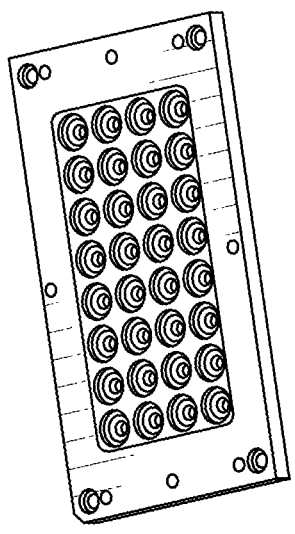
FIG. 5B is a diagram illustrating an exemplary environment in which some embodiments may operate.

As shown in FIG. 5C, three views 510, 512, 514 of a lower bank insertion "T" 508 are illustrated. As shown in FIG. 5D, two views 518, 520, 522 of a cylinder fitting component 516 and two views 522, 524 of an upper bank insertion "T" component 526 are illustrated. The "T" shape stainless steel component 508 may be inserted into a lower bank to provide one electrode for a channel in the electro-chemical module 184. In addition, a hollow, cylinder fitting component 516 may have a sliding hole for insertion into an upper bank. A spring may be inserted into the hollow cylinder and an upper bank T-shape stainless steel component 526 with a small hole is inserted into the hollow of the fitting component 516 and fixed with a small pin inserted into the hole in the "T" 526 and the sliding hole in the fitting component 516. The upper bank "T" component 526 may act as another electrode as well. Force created by a respective spring in each cell can guarantee to providing a well surface contact between the electrodes and the electrolyte. The upper and lower banks can be put together and sealed with a ring made of rubber or Teflon and screws. The upper bank has an air valve, which can connect to a vacuum pump to generate a vacuum environment inside the electro-chemical module, or filled the inert gas inside the electro-chemical module.

FIGS. 6A, 6B, and 6C provide lists of categories and chemicals upon which the training data 120 may be based. According to various embodiments, the training & tuning module 107 trains the machine learning model 130 according to any portion(s) of the training data 120.

Figure 7:
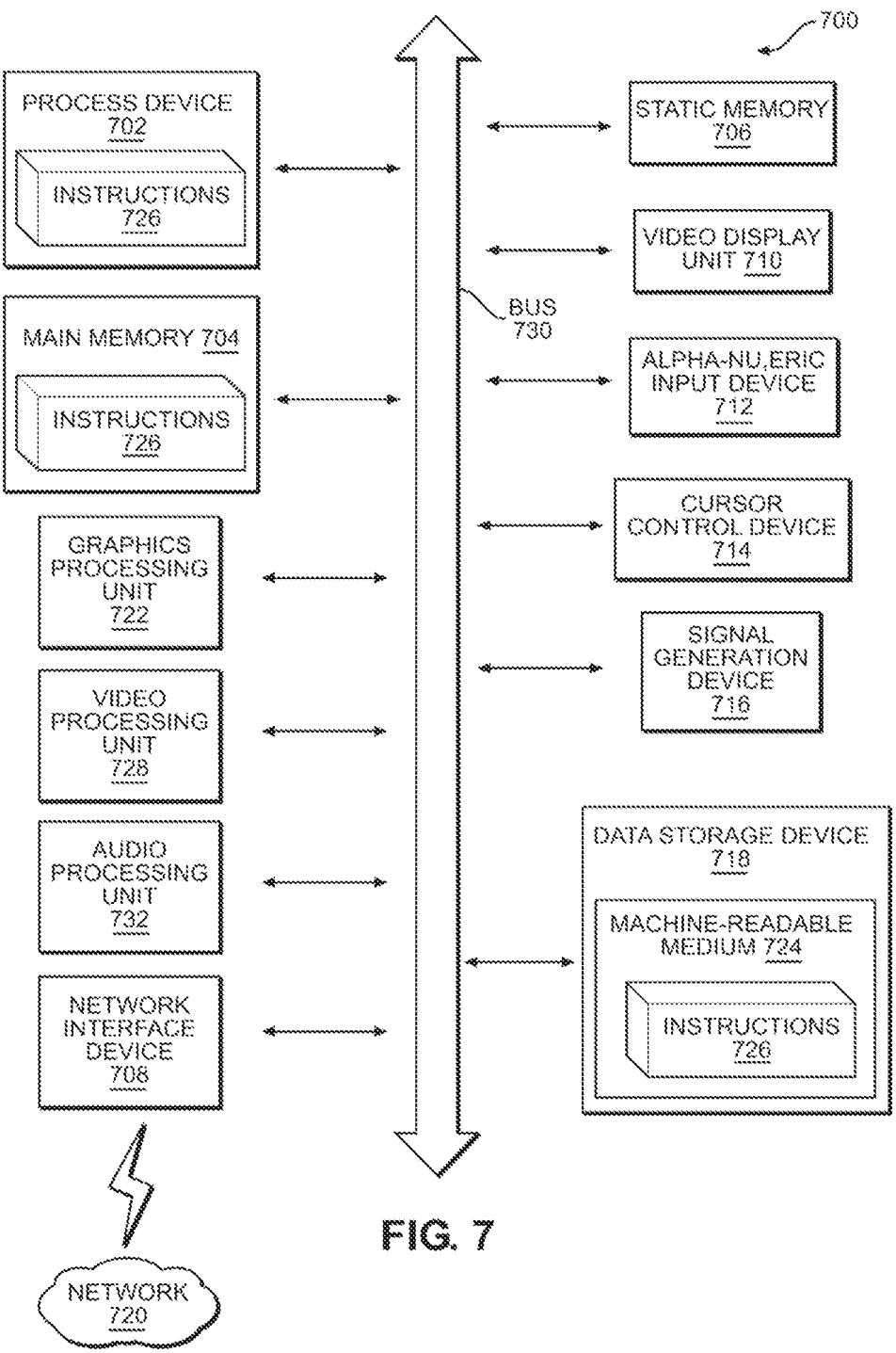
FIG. 7 is a diagram illustrating an exemplary computer that may perform processing in some embodiments.

FIG. 7 illustrates an example machine of a computer system within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

Processing device 702 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a computer-readable medium) on which is stored one or more sets of instructions or software 726 embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In one implementation, the instructions 726 include instructions to implement functionality corresponding to the components of a device to perform the disclosure herein. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Figure 8:
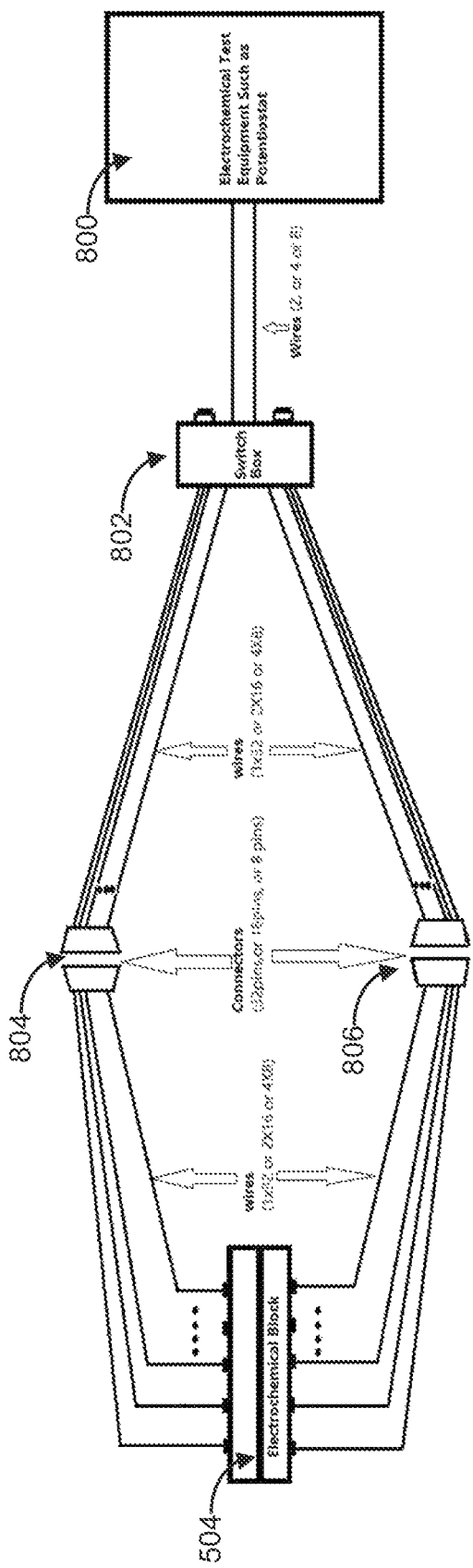
FIG. 8 is a diagram illustrating an exemplary environment in which some embodiments may operate.

As shown in FIG. 8, a two-pole switch box 802 has multiple wires connected to an upper bank connector 804 and multiple wires connected a lower bank connector 806. The connectors 804, 806 have wires connected to respective anode and cathode portions of each channel of the electro-chemical module 184. Each channel may contain an instance of a deposited recipe. For example, since the electro-chemical module 184 has 32-channels, each for holding its own deposit of a proposed recipe, then a wire may run from the top of each channel to a connector 804 and the bottom of each channel to the other connector 806. Likewise, wires designated for each channel, run from the connectors 804, 806 to switch box 802. The testing equipment 800 may be part of the robotic testing module 106 and introduce a constraint regarding how many channels may be tested at a time. As such, the switch box 802 provides controls to select how many channels to test and which channels to test at a given test iteration or cycle. Selection of channels for testing via the switch box may be commensurate with the testing constraints of the testing equipment 800. For example, if the test equipment provides for the testing of one channel, then the switch box 802 may be set to apply voltage to one channel via two wires—even though all channels have respective top and bottom wires running from the electro-chemical module 184 through the connectors 804, 806 and over to the switch box 802. In the case of testing of one channel, voltage will be applied via one wire connection at the input connector 804 and another wire via the output connector. In some embodiments, the electro-chemical module 184 and the wires running from the electro-chemical module 184 to the connectors 804, 806 may be encased in a protective station such that they are not readily or easily accessible. The wires running from the connectors 804, 806 to the switch box 802 and the switch box 802 itself may be outside the protective station. In other embodiments, only the switch box 802 and testing equipment 800 may be outside the protective station.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

Various general-purpose systems may be used with programs in accordance with the teachings herein, or it may prove convenient to construct a more specialized apparatus to perform the method. The structure for a variety of these systems will appear as set forth in the description above. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. The disclosure and drawings are, accordingly, to be regarded in an illustrative sense rather than a restrictive sense.

What is claimed is:

1. A computer-implemented method, comprising:
   generating, by a machine learning model executed by one or more processors of a computer system, a plurality of proposed different recipes of battery electrolytes by optimization of at least one objective function;
   preparing an instance of an electrolyte for each of the proposed different recipes of battery electrolytes using a robotic preparation module that obtains ingredients of battery electrolytes for the proposed different recipes, wherein the robotic preparation module includes a dispensing arm configured to aspirate and dispense different solutions to create the proposed recipes, a source module configured to acquire the ingredients of the proposed recipes, and a formulation module at which the ingredients of the proposed recipes are combined and mixed;
   depositing each instance of the prepared electrolyte into a separate well of an electrochemical module via the robotic preparation module, wherein the electrochemical module includes an upper block having multiple holes and a lower block having multiple wells, the upper block being configured to be fastened onto the lower block such that the multiple holes align with the multiple wells to form multiple channels with each instance of the prepared electrolyte in a separate channel, and wherein each of the multiple holes and wells includes an insertion configured to provide an electrode for its respective channel;
   executing a plurality of formulation characteristic tests, via a multichannel testing system, on each deposited instance of the prepared electrolyte in the electrochemical module via a robotic testing module, the robotic testing module loaded with a plurality of different tests for one or more of the battery electrolytes; and
   updating, via the one or more processors of the computer system, the machine learning model with a result of at least one of the formulation characteristic tests.

2. The computer-implemented method of claim 1, wherein generating a plurality of proposed different recipes of battery electrolytes comprises at least one of:
   generating a plurality of proposed different recipes for a polymer electrolyte; and
   generating a plurality of proposed different recipes for a liquid electrolyte.

3. The computer-implemented method of claim 2, wherein each proposed different recipe for the polymer electrolyte comprises:
   at least one type of polymer component with a corresponding weight percentage; and
   at least one type of lithium salt component with a corresponding lithium salt weight percentage.

4. The computer-implemented method of claim 2, wherein at least one objective function optimized by the plurality of proposed different recipes for a polymer electrolyte or the plurality of different recipes for a liquid electrolyte comprises:
   Ionic conductivity, lithium transference number, Young's modulus, tensile strength, elongation, adhesion, lithium diffusion coefficient, cathodic stability, anodic stability, viscosity, color, surface tension, solubility and cost.

5. The computer-implemented method of claim 1, wherein the machine learning model predicts one or more objective functions given a recipe; and
wherein the machine learning model applies a reinforcement learning technique to generate the plurality of proposed different recipes of battery electrolytes that provides at least one optimized objective function.

6. A computer program product comprising a non-transitory computer-readable medium having a computer-readable program code embodied therein to be executed by one or more processors, the program code including instructions to:
generate, by a machine learning model, a plurality of proposed different recipes of battery electrolytes by optimization of at least one objective function;
prepare an instance of an electrolyte for each of the proposed different recipes of battery electrolytes using a robotic preparation module that obtains ingredients of battery electrolytes for respective proposed different recipes, wherein the robotic preparation module includes a dispensing arm configured to aspirate and dispense different solutions to create the proposed recipes, a source module configured to acquire the ingredients of the proposed recipes, and a formulation module at which the ingredients of the proposed recipes are combined and mixed;
deposit each instance of the prepared electrolyte into a separate well of an electrochemical module via the robotic preparation module, wherein the electrochemical module includes an upper block having multiple holes and a lower block having multiple wells, the upper block being configured to be fastened onto the lower block such that the multiple holes align with the multiple wells to form multiple channels with each instance of the prepared electrolyte in a separate channel, and wherein each of the multiple holes and wells includes an insertion configured to provide an electrode for its respective channel;
execute a plurality of formulation characteristic tests, via a multichannel testing system, on each deposited instance of a solution in the electrochemical module via a robotic testing module, the robotic testing module loaded with a plurality of different tests for one or more of the battery electrolytes; and
update the machine learning model with a result of at least one of the formulation characteristic tests.

7. The computer program product of claim 6, wherein generate a plurality of proposed different recipes of battery electrolytes comprises at least one of:
generate a plurality of proposed different recipes for a polymer electrolyte; and
generate a plurality of proposed different recipes for a liquid electrolyte.

8. The computer program product of claim 7, wherein each proposed different recipe for the polymer electrolyte comprises:
at least one type of polymer component with a corresponding weight percentage; and
at least one type of lithium salt component with a corresponding lithium salt weight percentage.

9. The computer program product of claim 7, wherein the at least one objective function optimized by the plurality of proposed different recipes for a polymer electrolyte or the plurality of different recipes for a liquid electrolyte comprises:
Ionic conductivity, lithium transference number, Young's modulus, tensile strength, elongation, adhesion, lithium diffusion coefficient, cathodic stability, anodic stability, viscosity, color, surface tension, solubility and cost.

10. The computer program product of claim 6, wherein the machine learning model predicts one or more objective functions given a recipe; and
wherein the machine learning model applies a reinforcement learning technique to generate the plurality of proposed different recipes of battery electrolytes that provides at least one optimized objective function.

11. A system comprising:
one or more processors; and
a non-transitory computer readable medium storing a plurality of instructions, which when executed, cause the one or more processors to:
generate, by a machine learning model executed by the one or more processors, a plurality of proposed different recipes of battery electrolytes by optimization of at least one objective function;
prepare an instance of an electrolyte for each of the proposed different recipes of battery electrolytes using a robotic preparation module that obtains ingredients of battery electrolytes for the proposed different recipes, wherein the robotic preparation module includes a dispensing arm configured to aspirate and dispense different solutions to create the proposed recipes, a source module configured to acquire the ingredients of the proposed recipes, and a formulation module at which the ingredients of the proposed recipes are combined and mixed;
deposit each instance of the prepared electrolyte into a separate well of an electrochemical module via the robotic preparation module, wherein the electrochemical module includes an upper block having multiple holes and a lower block having multiple wells, the upper block being configured to be fastened onto the lower block such that the multiple holes align with the multiple wells to form multiple channels with each instance of the prepared electrolyte in a separate channel, and wherein each of the multiple holes and wells includes an insertion configured to provide an electrode for its respective channel;
execute a plurality of formulation characteristic tests, via a multichannel testing system, on each deposited instance of the prepared electrolyte in the electrochemical module via a robotic testing module, the robotic testing module loaded with a plurality of different tests for one or more of the battery electrolytes; and
update, via the one or more processors, the machine learning model with a result of at least one of the formulation characteristic tests.

12. The system of claim 11, wherein generate a plurality of proposed different recipes of battery electrolytes comprises at least one of:
generate a plurality of proposed different recipes for a polymer electrolyte; and
generate a plurality of proposed different recipes for a liquid electrolyte.

13. The system of claim 12, wherein each proposed different recipe for the polymer electrolyte comprises:
at least one type of polymer component with a corresponding weight percentage; and
at least one type of lithium salt component with a corresponding lithium salt weight percentage.

14. The system of claim 12, wherein the at least one objective function optimized by the plurality of proposed different recipes for a polymer electrolyte or the plurality of different recipes for a liquid electrolyte comprises:

Ionic conductivity, lithium transference number, Young's modulus, tensile strength, elongation, adhesion, lithium diffusion coefficient, cathodic stability, anodic stability, viscosity, color, surface tension, solubility and cost.

15. The system of claim 11, wherein the machine learning model predicts one or more objective functions given a recipe; and
   wherein the machine learning model applies a reinforcement learning technique to generate the plurality of proposed different recipes of battery electrolytes that provides at least one optimized objective function.

16. The computer-implemented method of claim 1, further comprising:
   mixing ingredients of a solution by shaking the solution via a shaking station.

17. The computer-implemented method of claim 1, wherein each channel further includes a spring configured to guarantee contact between each electrode and the electrolyte contained within the channel.

18. The computer-implemented method of claim 1, wherein each insertion comprises a T-shaped component configured to extend through an opening in its respective upper or lower block to provide an electrode within and an electrical contact outside its respective channel.

19. The computer-implemented method of claim 1, wherein the electrochemical module further includes a sealing component configured to form a seal between the upper and lower blocks when the upper block is fastened onto the lower block.

20. The computer-implemented method of claim 1, wherein the electrochemical module further includes an air valve configured to generate a vacuum or inert gas environment within the electrochemical module.

21. The computer-implemented method of claim 1, wherein the machine learning model proposes weight percentages for polymers, plasticizers, lithium salts, and additives for each electrolyte recipe.

22. The computer-implemented method of claim 21, wherein each electrolyte recipe includes:
   one or more polymers ranging from 2-99 wt %,
   one or more salts ranging from 2-80 wt %,
   one or more plasticizers ranging from 0-90 wt %, and
   one or more additives ranging from 0-40 wt %.

\* \* \* \* \*